United States Patent
Chen et al.

(10) Patent No.: US 11,756,699 B1
(45) Date of Patent: Sep. 12, 2023

(54) CONDUCTIVE SILVER ALUMINUM PASTE, PREPARATION METHOD, ELECTRODE AND CELL

(71) Applicant: Shanghai Silver Paste Sci. & Tech. Co., LTD., Shanghai (CN)

(72) Inventors: Xiaolong Chen, Shanghai (CN); Liang Qiao, Shanghai (CN); Bing Liu, Shanghai (CN); Jie Liu, Shanghai (CN); Can Ma, Shanghai (CN); Yun Wang, Shanghai (CN)

(73) Assignee: SHANGHAI SILVER PASTE SCI. & TECH. CO., LTD., Shanghai (CN)

( * ) Notice: Subject to any disclaimer, the term of this patent is extended or adjusted under 35 U.S.C. 154(b) by 0 days.

(21) Appl. No.: 17/986,785

(22) Filed: Nov. 14, 2022

(30) Foreign Application Priority Data

May 20, 2022 (CN) .......................... 202210552555.1

(51) Int. Cl.
*H01B 1/22* (2006.01)
*H01L 31/0224* (2006.01)

(52) U.S. Cl.
CPC ....... *H01B 1/22* (2013.01); *H01L 31/022425* (2013.01)

(58) Field of Classification Search
CPC ........................... H01B 1/22; H01L 31/022425
See application file for complete search history.

(56) References Cited

U.S. PATENT DOCUMENTS

2011/0143497 A1   6/2011   Enomoto et al.

FOREIGN PATENT DOCUMENTS

| CN | 103514973 | A | | 1/2014 | |
|---|---|---|---|---|---|
| CN | 104170094 | A | | 11/2014 | |
| CN | 107195354 | A | | 9/2017 | |
| CN | 113257457 | A | * | 8/2021 | ............ C03C 3/066 |
| CN | 113257457 | A | | 8/2021 | |
| WO | 2014/162818 | A1 | | 10/2014 | |

* cited by examiner

*Primary Examiner* — Khanh T Nguyen
(74) *Attorney, Agent, or Firm* — Cheng-Ju Chiang

(57) ABSTRACT

A conductive silver aluminum paste includes the following components by weight percentage: 80.0%-90.0% of silver powder; 0.3%-2.5% of aluminum powder; 0.0%-1.5% of silicon powder; 1.0%-6.0% of first-type glass powder; 0.5%-4.0% of second-type glass powder; and 7.0%-15.0% of organic vehicle. The first-type glass powder is Pb-Zn-B-O-M glass powder, and the second-type glass powders is Ba-B-O-M glass powder, M is at least one of alkali metal elements; the organic vehicle is a vehicle of organic resin and/or cellulose, and a content of the organic resin and/or the cellulose in the organic vehicle is not higher than 10.0% of a total mass of the organic vehicle. By introducing two different types of glass powder, the contact resistance between the metal grid and the PN junction layer is reduced, thereby obtaining high-performance silver aluminum pastes for N-type Topcon monocrystalline silicon cells and high-efficiency electrode metallization for N-type silicon solar cells.

10 Claims, No Drawings

CONDUCTIVE SILVER ALUMINUM PASTE, PREPARATION METHOD, ELECTRODE AND CELL

FIELD OF THE INVENTION

The invention relates to the field of silicon solar cells, and in particular to a conductive silver aluminum paste, a preparation method thereof, an electrode and a cell having the same.

BACKGROUND OF THE INVENTION

With the increasing consumption of traditional fossil energy in the world, fossil energy is facing a crisis of exhaustion within a century, and the rising oil price also causes cost increasing of people's lives. At the same time, the environmental pollution caused by excessive use of fossil energy is becoming more and more prominent. The development and research of new energy in the world is reaching an unprecedented height, which promotes the rapid development of solar power generation technology in the past decade.

In just a few years, P-type silicon solar power technology has experienced rapid development from polycrystalline silicon cells to monocrystalline silicon cells, to perc monocrystalline cells, and then to the current mainstream Se-perc monocrystalline cells, constantly pursuing the improvement of photoelectric conversion efficiency of cells. However, the low minority carrier lifetime and the increased light induced degradation of P-type silicon severely limit and restrict the further improvement of the photoelectric conversion efficiency of P-type silicon cells. Compared with P-type silicon, N-type silicon has advantages of higher minority carrier lifetime and less light induced degradation, but has a slower development than P-type silicon due to technical and process limitations however.

In recent years, with the breakthrough of new battery technology and the development of new processes, N-type silicon cells made a major breakthrough, especially the emergence of N-type Topcon monocrystalline silicon cells gradually present the advantages of high conversion efficiency of N-type silicon cells. At the same time, N-type silicon cells also have advantages of good weak light response and low temperature coefficient, which make N-type silicon cells have not only high power generation, but also good stability. Therefore, N-type Topcon monocrystalline silicon cells will eventually replace the current mainstream P-type Se-perc monocrystalline cells and become the new mainstream, in the next few years.

In order to match the N-type monocrystalline silicon cells, higher requirements for silver aluminum pastes as the electrode material for the manufacture of silicon-based solar cells has been proposed. Therefore, it is of great technical significance to develop electrode metalized silver aluminum pastes with high efficiency and low contact resistance.

SUMMARY OF THE INVENTION

The purpose of the present invention is to provide a conductive silver aluminum paste, a preparation method, an electrode and a cell. By introducing two different types of glass powder, the sintering process of the N-type Topcon monocrystalline silicon cell is effectively matched, the contact resistance between the metal grid and the PN junction is reduced, and the corrosion strength of the anti-reflection film is preferably controlled, thereby obtaining high-performance silver aluminum pastes for N-type Topcon monocrystalline silicon cells and high-efficiency electrode metallization for N-type silicon solar cells. To achieve the above purpose, the technical solutions of the present invention follow.

The present invention provides a conductive silver aluminum paste including a silver powder, an aluminum powder, a silicon powder, a first-type glass powder, a second-type glass powder and an organic vehicle; the conductive silver aluminum paste having a total weight of 100% and including the following components by weight percentage:
80.0%-90.0% of silver powder;
0.3%-2.5% of aluminum powder;
0.0%-1.5% of silicon powder;
1.0%-6.0% of first-type glass powder;
0.5%-4.0% of second-type glass powder; and
7.0%-15.0% of organic vehicle;
wherein the first-type glass powder is Pb-Zn-B-O-M glass powder, and the second-type glass powders is Ba-B-O-M glass powder, M is at least one of alkali metal elements; the organic vehicle is a vehicle of organic resin and/or cellulose, and a content of the organic resin and/or the cellulose in the organic vehicle is not higher than 10.0% of a total mass of the organic vehicle.

Further, the first-type glass powder has a total mole number of 100% for all components and includes the following components by molar percentage:
25.0%-60.0% of PbO;
5.0%-20.0% of ZnO;
10.0%-50.0% of $B_2O_3$;
5.0%-20.0% of alkali metal element substance; and
0.0%-20.0% of a first-type modified element additive.

Further, the second-type glass powder has a total mole number of 100% for all components and includes the following components by molar percentage:
25.0%-50.0% of BaO;
10.0%-50.0% of $B_2O_3$;
5.0%-25.0% of alkali metal element substance; and
0.0%-35.0% of a second-type modified element additive.

Further, the first-type modified element additive is an oxide containing one or more elements selected from the group consisting of Al, Tl, Ca, Mg, Si, Bi, Ge and Te, or a compound of element oxides decomposed from a preparation process of the first-type glass powder.

Further, the second-type modified element additive is an oxide containing one or more selected from the group consisting of Al, Tl, Ca, Mg, Si, Bi, Ge, Te, Pb and Zn, or a compound of element oxides decomposed from a preparation process of the second-type glass powder.

Further, the alkali metal element substance is an oxide or halide containing one or more elements selected from the group consisting of Li, Na, K and Rb, or a compound of alkali metal oxides decomposed from a preparation process of glass powder.

Further, the organic vehicle further includes an organic solvent, a thickening agent and an antifoaming agent, and the organic vehicle has a total weight of 100% and includes the following components by weight:
60.0%-80.0% of organic solvent;
0.0%-10.0% organic resin or cellulose;
5.0%-20.0% of thickening agent; and
0.1%-20.0% of antifoaming agent.

The present invention further provides a method for preparing the aforementioned conductive silver aluminum paste including the following steps:

(1) preparation of first-type glass powder, second-type of glass powder and organic vehicle: weighing raw materials for the first-type glass powder according to a preset formula ratio, mixing, then heating, melting, cooling and drying, and then milling to yield the first-type glass powder; weighing raw materials for the second-type glass powder according to a preset formula ratio, and mixing, then heating, melting, cooling and drying, and then milling to yield the second-type glass powder; and weighing raw materials for the organic vehicle according to a preset formula ratio, stirring and mixing, and dispersing evenly by high-speed centrifugation to yield the organic vehicle; and (2) preparation of conductive silver aluminum paste: adding the silver powder, the aluminum powder, the silicon powder, the prepared first-type glass powder and the prepared second-type glass powder to the prepared organic vehicle, stirring and mixing evenly, pulping, filtering and pulp conditioning to yield the conductive silver aluminum paste.

The present invention further provides an electrode including the aforementioned conductive silver aluminum paste.

The present invention further provides a cell containing conductive silver aluminum paste, and the cell includes the aforementioned electrode.

In conclusion, two different types of glass powder are used in the silver aluminum paste in the present invention. The first-type glass powder has strong etching ability to the insulating anti-reflection film on the surface of the cell, thus the anti-reflection film can be preferably etched, meanwhile this type of glass powder has good burning ability to the silver powder, but weak melting ability (namely weak burning ability) to the aluminum powder. The second-type glass powder has weak oxidation and weak etching ability to the insulating antireflection film on the surface of the cell and weak burning ability to the silver powder, but has strong melting ability to the aluminum powder and strong burning ability. In silver aluminum pastes prepared by using the two types of glass powder, good burning ability to both the silver powder and the aluminum powder is obtained, and the etching ability of the insulating anti-reflection film on the surface of the cell is effectively controlled; meanwhile, the body resistance of the grid is reduced, the contact resistance between the silver grid and the PN junction layer is improved, the damage of the glass to the PN layer is effectively reduced accordingly, and the output voltage of the cell is further improved, that is, low contact resistance and high output voltage of the cell are achieved, and the photoelectric conversion efficiency of the cell is also improved.

Based on the strong melting ability of the first-type glass powder to silver and the weak melting ability of the second-type glass powder to silver, it's beneficial to the precipitation of nano-silver particles in the mixing process of the molten glass liquid during the sintering of the two types of glass powder, which further reduces the contact resistance. The second-type glass powder can melt to aluminum preferably, which prevents the formation of more aluminum silicon alloy, thereby further improving the open-circuit voltage of the cell.

DETAILED DESCRIPTION OF ILLUSTRATED EMBODIMENTS

A conductive silver aluminum paste including a silver powder, an aluminum powder, a silicon powder, a first-type glass powder, a second-type glass powder and an organic vehicle; the conductive silver aluminum paste having a total weight of 100% and including the following components by weight percentage:

80.0%-90.0% of silver powder;
0.3%-2.5% of aluminum powder;
0.0%-1.5% of silicon powder;
1.0%-6.0% of first-type glass powder;
0.5%-4.0% of second-type glass powder; and
7.0%-15.0% of organic vehicle.

Further, the silver powder may account for 80%, 82%, 84%, 86%, 88%, 90% of the total weight of conductive silver aluminum paste; the aluminum powder may account for 0.3%, 0.6%, 0.9%, 1.2%, 1.5%, 1.8%, 2.1%, 2.5% of the total weight of conductive silver aluminum paste; the silicon powder may account for 0%, 0.3%, 0.6%, 0.9%, 1.2%, 1.5% of the total weight of conductive silver aluminum paste; the first-type glass powder may account for 1%, 2%, 3%, 4%, 5%, 6% of the total weight of conductive silver aluminum slurry; the second-type glass powder may account for 0.5%, 1%, 1.5%, 2.2%, 3%, 3.5%, 4% of the total weight of conductive silver aluminum paste; and the organic vehicle may account for 7%, 9%, 10%, 11%, 12%, 13%, 15% of the total weight of conductive silver aluminum paste.

Specifically, the silver powder and the aluminum powder may be spherical, which is not limited however. The silver powder, the aluminum powder, the silicon powder, the first-type glass powder and the second-type glass powder are all solid powder, whose particle size is 0.5-10 microns. The first-type glass powder is Pb-Zn-B-O-M glass powder, the second-type glass is Ba-B-O-M glass powder, where M is at least one of the alkali metal elements. The organic vehicle is a vehicle containing organic resin and/or cellulose, a content of the organic resin and/or the cellulose in the organic vehicle is not higher than 10.0% of total mass of the organic vehicle, which specifically means that the content of the organic resin is not higher than 10.0% of the total mass of the organic vehicle when only organic resin is contained, or the content of the cellulose is not higher than 10.0% of the total mass of the organic vehicle when only cellulose is contained, or the total content of organic resin and the cellulose is not higher than 10.0% of the total mass of the organic vehicle when both organic resin and cellulose are contained.

Further, in the conductive silver aluminum paste, the first-type glass powder contains a first-type modified element additive. The first-type glass powder has a total mole number of 100% for all components and includes the following components by molar percentage:

25.0%-60.0% of PbO;
5.0%-20.0% of ZnO;
10.0%-50.0% of $B_2O_3$;
5.0%-20.0% of alkali metal element substance; and
0.0%-20.0% of first-type modified element additive.

Specifically, the first-type modified element additive is an oxide containing one or more elements selected from the group consisting of Al, Tl, Ca, Mg, Si, Bi, Ge and Te, or a compound of element oxides decomposed from a preparation process of the first-type glass powder.

Similarly, in the first-type glass powder, PbO, ZnO, $B_2O_3$ or other ingredients may be those oxides directly added, or may be a compound of the aforementioned ingredients decomposed from the preparation process of the first-type glass powder.

Similarly, the second-type glass powder has a total mole number of 100% for all components and includes the following components by molar percentage:

25.0%-50.0% of BaO;
10.0%-50.0% of $B_2O_3$;
5.0%-25.0% of alkali metal element substance; and
0.0%-35.0% of a second-type modified element additive.

Specifically, the second-type modified element additive is an oxide containing one or more selected from the group consisting of Al, Tl, Ca, Mg, Si, Bi, Ge, Te, Pb and Zn, or a compound of element oxides decomposed from a preparation process of the second-type glass powder.

Similarly, in the second-type glass powder, BaO, $B_2O$ or other ingredients may be those oxides directly added, or may be a compound of the aforementioned ingredients decomposed from the preparation process of the second-type glass powder.

The alkali metal element substance is an oxide or halide containing one or more elements selected from the group consisting of Li, Na, K and Rb, or a compound of alkali metal oxides decomposed from a preparation process of glass powder. Preferably, the alkali metal element substance is an oxide or halide containing one or more elements selected from the group consisting of Li and Na, or a compound of alkali metal oxides decomposed from a preparation process of glass powder.

The organic vehicle further includes an organic solvent, a thickening agent and an antifoaming agent, and the organic vehicle has a total weight of 100% and includes the following components by weight:
60.0%-80.0% of organic solvent;
0.0%-10.0% organic resin or cellulose;
5.0%-20.0% of thickening agent; and
0.1%-20.0% of antifoaming agent.

Specifically, the organic solvents may be one or more selected from the group consisting of terpineol, texanol, butyl carbitol, diethylene glycol butylether acetate and glycerol; the organic resin may be one or more selected from the group consisting of isophthalic acid alkyd resin, acrylic resin, petroleum resin and rosin resin; and the cellulose may be one or more selected from the group consisting of ethyl cellulose and methyl cellulose.

The present invention further provides a method for preparing the aforementioned conductive silver aluminum paste including the following steps.

S1, Preparation of first-type glass powder, second-type of glass powder and organic vehicle: raw materials of first-type glass powder according to a preset formula ratio were calculated and weighed, and then mixed evenly and added to a crucible which was then placed to a muffle furnace, at 750° C.-1100° C. for 20-60 min. Until the raw materials were completely melted and reacted, the glass liquid was poured into a low-temperature twin roller or a low-temperature ice tank to cool down, and then dried by high-speed airflow at room temperature to obtain glass particles. Then the dried glass particles were added to a disc mill and crushed into primary glass powders under a disc gap of 50-200 microns. Finally, the primary glass powders were crushed into the first-type glass powders with particle size of 0.5-10 microns under a pressure of 6-12 Mpa by a jet mill. Based on the preparation method of the first-type glass powder, the method further includes weighing raw materials for the second-type glass powder according to a preset formula ratio, mixing, then heating, melting, cooling and drying, and then milling to yield the second-type glass powder; and weighing raw materials for the organic vehicle according to a preset formula ratio, stirring and mixing, and dispersing evenly by high-speed centrifugation to yield the organic vehicle.

S2, Preparation of conductive silver aluminum paste: adding the silver powder, the aluminum powder, the silicon powder, the prepared first-type glass powder and the prepared second-type glass powder in mass ratio to the prepared organic vehicle, stirring and mixing evenly, pulping by a three-roll mill, filtering to obtain a coarse pulp, and finally testing and adjusting viscosity of the coarse pulp to yield the conductive silver aluminum paste.

In this embodiment, two different types of glass powder are used in the silver aluminum paste. The first-type glass powder is Pb-Zn-B-O-M glass powder, which has strong etching ability to the insulating anti-reflection film on the surface of the cell, thus the anti-reflection film can be preferably etched, and this type of glass powder has good burning ability to the silver powder, but weak melting ability (namely weak burning ability) to the aluminum powder. The second-type glass powder is Ba-B-O-M glass powder, which has weak oxidation and weak etching ability to the insulating antireflection film on the surface of the cell and weak burning ability to the silver powder, but has strong melting ability to the aluminum powder and strong burning ability. In silver aluminum pastes prepared by using the two types of glass powder, good burning ability to both the silver powder and the aluminum powder is obtained, and the etching ability of the insulating anti-reflection film on the surface of the cell is effectively controlled; meanwhile, the body resistance of the grid is reduced, the contact resistance between the silver grid and the PN junction layer is improved, the damage of the glass to the PN layer is effectively reduced accordingly, and the output voltage of the cell is further improved, that is, low contact resistance and high output voltage of the cell are achieved, and the photoelectric conversion efficiency of the cell is also improved.

Further, based on the strong melting ability of the first-type glass powder to silver and the weak melting ability of the second-type glass powder to silver, it's beneficial to the precipitation of nano-silver particles in the mixing process of the molten glass liquid during the sintering of the two types of glass powder, which further reduces the contact resistance. The second-type glass powder can melt to aluminum preferably, which prevents the formation of more aluminum silicon alloy, thereby further improving the open-circuit voltage of the cell.

The invention further provides an electrode including the conductive silver aluminum paste as mentioned above. Other technical features of the electrode may be referenced to prior art, which are not repeated here.

The invention further provides a cell including the electrode as mentioned above. Other technical features of the cell may be referenced to prior art, which are not repeated here.

Detailed descriptions of the invention in combination with examples and specific embodiments follow. However, the scope of the above subject matter of the invention is not limited to the following embodiments, and all techniques implemented based on the contents of the invention belong to the scope of the invention.

Specific examples are illustrated as follows.

Examples GA01-GA06:

Preparation of first-type glass powder: raw materials of first-type glass powder according to a preset formula ratio were calculated and weighed, the alkali metal oxide added was carbonate with corresponding ratio to that oxide as its stable property and resistant to oxidation and deterioration, and then all the raw materials were mixed evenly and added to a crucible which was then placed to a muffle furnace, at 750° C.-1100° C. for 20-60 min. Until the raw materials were completely melted and reacted, the glass liquid was poured into a low-temperature twin roller or a low-temperature ice tank to cool down, and then dried by high-speed airflow at room temperature to obtain glass particles. Then the dried glass particles were added to a disc mill and crushed into primary glass powders under a disc gap of 50-200 microns. Finally, the primary glass powders were crushed into the first-type glass powders GA01-GA06 with particle size of 0.5-10 microns under a pressure of 6-12 Mpa by a jet mill. The specific composition ratio of each first-type glass powder is shown in Table 1.

TABLE 1

Molar composition of first-type class powder (at %)

| Ingredient | GA01 | GA02 | GA03 | GA04 | GA05 | GA06 |
|---|---|---|---|---|---|---|
| PbO | 36.0 | 37.4 | 60.0 | 25.0 | 30.0 | 36.7 |
| ZnO | 15.0 | 10.0 | 5.0 | 20.0 | 9.6 | 12.5 |
| $B_2O_3$ | 27.5 | 21.0 | 10.0 | 48.0 | 30.8 | 24.2 |
| $Li_2CO_3$ | 15.3 | 15.0 | 5.0 | 5.0 | 18.0 | 15.7 |
| $Na_2CO_3$ | 0.5 | 0.0 | | | | |
| $K_2CO_3$ | | | 0.2 | | | |
| LiF | 0.0 | 1.0 | | | | |
| NaCl | | | | | 1.2 | |
| $Al_2O_3$ | 1.2 | 0.6 | | | | 1.1 |
| $Tl_2O_3$ | | | 0.8 | | | |
| $CaCO_3$ | | | | 0.6 | | |
| MgO | | | | 1.0 | | |
| $SiO_2$ | 4.5 | 15.0 | 19.0 | | 8.8 | 9.8 |
| $Bi_2O_3$ | | | | 1.0 | | |
| $GeO_2$ | | | | 0.6 | | |
| $TeO_2$ | | | | 0.4 | | |
| Total | 100.0 | 100.0 | 100.0 | 100.0 | 100.0 | 100.0 |

Examples GB01-GB06:

Preparation of second-type glass powder: raw materials of second-type glass powder according to a preset formula ratio were calculated and weighed, the alkali metal oxide added was carbonate with corresponding ratio to that oxide, $BaCO_3$ with corresponding ratio was selected as BaO, and then all the raw materials were mixed evenly and added to a crucible which was then placed to a muffle furnace, at 750° C. -1100° C. for 20-60 min. Until the raw materials were completely melted and reacted, the glass liquid was poured into a low-temperature twin roller or a low-temperature ice tank to cool down, and then dried by high-speed airflow at room temperature to obtain glass particles. Then the dried glass particles were added to a disc mill and crushed into primary glass powders under a disc gap of 50-200 microns. Finally, the primary glass powders were crushed into the second-type glass powders GB01-GB06 with particle size of 0.5-10 microns under a pressure of 6-12 Mpa by a jet mill. The specific composition ratio of each second-type glass powder is shown in Table 2.

TABLE 2

Molar composition of second-type glass powder (at %)

| Ingredient | GB01 | GB02 | GB03 | GB04 | GB05 | GB06 |
|---|---|---|---|---|---|---|
| $BaCO_3$ | 33.0 | 28.0 | 50.0 | 39.8 | 37.9 | 25.8 |
| $B_2O_3$ | 48.0 | 21.0 | 10.0 | 30.0 | 37.0 | 18.5 |
| $Li_2CO_3$ | 10.0 | 18.0 | 5.0 | 12.0 | 24.5 | 21.2 |
| $Na_2CO_3$ | 0.5 | | | | | |
| LiF | | | 0.5 | | | |
| NaCl | | | 0.5 | | | |
| $Al_2O_3$ | 1.5 | 1.2 | | 1.2 | 0.6 | |
| $Tl_2O_3$ | | | 5.0 | | | |
| $CaCO_3$ | 3.0 | | | | | 1.5 |
| MgO | | | | 2.0 | | |
| $SiO_2$ | 3.0 | 30.0 | 20.0 | 12.0 | | 33.0 |
| $Bi_2O_3$ | | | 1.0 | | | |
| $GeO_2$ | | | 4.0 | | | |
| $TeO_2$ | | | 2.4 | | | |
| PbO | 1.0 | 1.8 | | 3.0 | | |
| ZnO | | | 1.6 | | | |
| Total | 100.0 | 100.0 | 100.0 | 100.0 | 100.0 | 100.0 |

Examples OC01-OC06:

Preparation of organic vehicle: the prepared raw material for organic vehicle was weighed according to a preset formula ratio, stirred and mixed, and evenly dispersed by high-speed centrifugation to obtain organic vehicles OC01-OC06 for standby. The composition ratio of each organic vehicle is shown in Table 3.

TABLE 3

Weight composition of organic vehicle (wt %)

| Ingredient | OC01 | OC02 | OC03 | OC04 | OC05 | OC06 |
|---|---|---|---|---|---|---|
| Organic solvent | 60.0 | 75.0 | 80.0 | 65.2 | 80.0 | 75.0 |
| Organic resin | 2.5 | | 1.0 | 9.8 | | 3.0 |
| Cellulose | 2.5 | | | | 4.5 | 3.0 |
| Thickening agent | 20.0 | 15.0 | 10.0 | 5.0 | 15.0 | 7.5 |
| Antifoaming agent | 15.0 | 10.0 | 9.0 | 20.0 | 0.5 | 11.5 |
| Total | 100.0 | 100.0 | 100.0 | 100.0 | 100.0 | 100.0 |

Examples PI01-PI12:

Preparation of conductive silver aluminum paste: selecting each appropriate composition from silver powder of No. Ag01, aluminum powder of No. Al01, silicon powder of No. Si01, the prepared first-type glass powder of No. GA01-GA06, the prepared second-type glass powder of No. GB01-GB06 and the prepared organic vehicle of No. OC01-OC06, and adding the compositions in certain mass ratio into the prepared organic vehicle, which were mixed and stirred evenly, and then pulped by a three-roll mill and filtered to obtain a coarse pulp, and finally conditioning the coarse pulp to yield conductive silver aluminum pastes PI01-PI12. The specific composition of silver aluminum paste is shown in Table 4.

TABLE 4

Weight composition of silver aluminum paste (wt %)

| Paste No. | Item | Silver power | Aluminum power | Silicon powder | First-type glass powder | Second-type glass powder | Organic vehicle |
|---|---|---|---|---|---|---|---|
| PI01 | Composition No. | Ag01 | Al01 | Si01 | GA01 | GB01 | OC01 |
|  | Content | 87.0 | 1.2 |  | 2.0 | 1.0 | 8.8 |
| PI02 | Composition No. | Ag01 | Al01 | Si01 | GA01 | GB06 | OC06 |
|  | Content | 84.8 | 2.4 |  | 2.0 | 1.8 | 9.0 |
| PI03 | Composition No. | Ag01 | Al01 | Si01 | GA02 | GB02 | OC05 |
|  | Content | 85.5 | 0.8 | 0.2 | 2.5 | 2.0 | 9.0 |
| PI04 | Composition No. | Ag01 | Al01 | Si01 | GA01/GA03 | GB04 | OC01 |
|  | Content | 82.5 | 1.0 |  | 4.5/1.5 | 0.5 | 10.0 |
| PI05 | Composition No. | Ag01 | Al01 | Si01 | GA04 | GB05 | OC03 |
|  | Content | 82.7 | 0.3 |  | 1.0 | 4.0 | 12.0 |
| PI06 | Composition No. | Ag01 | Al01 | Si01 | GA04/GA05 | GB04 | 0CO4 |
|  | Content | 85.0 | 1.5 |  | 1.2/2.7 | 2.4 | 7.2 |
| PI07 | Composition No. | Ag01 | Al01 | Si01 | GA06 | GB03 | 0CO2 |
|  | Content | 80.0 | 0.3 | 0.1 | 4.1 | 0.5 | 15.0 |
| PI08 | Composition No. | Ag01 | Al01 | Si01 | GA05 | GB03/GB06 | OC03 |
|  | Content | 83.0 | 1.5 | 1.5 | 6.0 | 1.0/0.5 | 8.0 |
| PI09 | Composition No. | Ag01 | Al01 | Si01 | GA02 | GB06 | OC01 |
|  | Content | 85.7 | 1.2 | 0.6 | 2.5 | 1.6 | 8.4 |
| PI10 | Composition No. | Ag01 | Al01 | Si01 | GA01 | GB01 | OC01 |
|  | Content | 90.0 | 0.6 |  | 1.6 | 0.8 | 7.0 |
| PI11 | Composition No. | Ag01 | Al01 | Si01 | GA01/GA04 | GB01/GB05 | OC01 |
|  | Content | 85.6 | 1.2 |  | 1.2/0.6 | 0.5/0.4 | 10.5 |
| PI12 | Composition No. | Ag01 | Al01 | Si01 | GA06 | GB04 | 0CO2 |
|  | Content | 85.0 | 1.0 | 0.4 | 3.0 | 1.5 | 9.1 |

Test examples:

The silver aluminum paste prepared by the above Examples PI01-PI12 was respectively screen-printed on surfaces of a conventional N-type double-sided cell and N-type Topcon cell, and then dried, sintered and cooled to obtain a cell containing a printed silver grid electrode whose electrical performance was tested. In order to conveniently observe the electrical performance characteristics of the silver aluminum paste of the invention, the N-type silver aluminum paste S0L9400 of Heraeus and the N-type silver aluminum paste JLZ03 of LG of Korea were specially selected to compare with the invention, which were printed sintered and tested under the same conditions. The electrical performance test results are shown in Table 5.

TABLE 5

Electrical performance test of silver aluminum paste

|  | Paste No. | Type of cell | Open-circuit voltage (V) | Series resistance (mΩ) | Photoelectric conversion efficiency |
|---|---|---|---|---|---|
| Comparative Example | SOL9400 | N-type monocrystalline silicon cell | 0.6745 | 2.403 | 21.75% |
|  | JLZ03 | N-type monocrystalline silicon cell | 0.6731 | 2.347 | 21.73% |
| Example | PI01 | N-type monocrystalline silicon cell | 0.6766 | 2.255 | 21.91% |
|  | PI02 | N-type monocrystalline silicon cell | 0.6772 | 2.301 | 21.93% |
|  | PI03 | N-type monocrystalline silicon cell | 0.6759 | 2.278 | 21.86% |

TABLE 5-continued

Electrical performance test of silver aluminum paste

|  | Paste No. | Type of cell | Open-circuit voltage (V) | Series resistance (mΩ) | Photoelectric conversion efficiency |
|---|---|---|---|---|---|
|  | PI04 | N-type monocrystalline silicon cell | 0.6768 | 2.283 | 21.90% |
|  | PI05 | N-type monocrystalline silicon cell | 0.6762 | 2.312 | 21.83% |
|  | PI06 | N-type monocrystalline silicon cell | 0.6775 | 2.284 | 21.98% |
| Comparative | SOL9400 | N-type Topcon cell | 0.6942 | 1.987 | 23.05% |
| Example | JLZ03 | N-type Topcon cell | 0.6936 | 1.877 | 23.03% |
| Example | PI01 | N-type Topcon cell | 0.6978 | 1.685 | 23.23% |
|  | PI02 | N-type Topcon cell | 0.6981 | 1.722 | 23.25% |
|  | PI03 | N-type Topcon cell | 0.6956 | 1.756 | 23.11% |
|  | PI04 | N-type Topcon cell | 0.6969 | 1.817 | 23.16% |
|  | PI05 | N-type Topcon cell | 0.6964 | 1.783 | 23.15% |
|  | PI06 | N-type Topcon cell | 0.6988 | 1.566 | 23.31% |
|  | PI07 | N-type Topcon cell | 0.6960 | 1.825 | 23.09% |
|  | PI08 | N-type Topcon cell | 0.6962 | 1.802 | 23.13% |
|  | PI09 | N-type Topcon cell | 0.6977 | 1.702 | 23.20% |
|  | PI10 | N-type Topcon cell | 0.6979 | 1.809 | 23.19% |
|  | PI11 | N-type Topcon cell | 0.6971 | 1.643 | 23.27% |
|  | PI12 | N-type Topcon cell | 0.6976 | 1.788 | 23.24% |

From Table 5, by comparing Examples PI01-PI12 of the invention with Comparative Example S0L9400 of Heraeus and Comparative Example JLZ03 of LG of Korea, it is found that, for either N-type monocrystalline silicon cell or N-type Topcon cell, the silver aluminum paste of the invention has obvious open-circuit voltage improvement, and lower series resistance and larger efficiency advantage. Especially Example PI06 has most prominent advantages and has higher photoelectric conversion efficiency, indicating that the silver aluminum paste of the invention has good contact effect, high open-circuit voltage and high photoelectric conversion efficiency.

It should be noted that each of the embodiments in this disclosure is described in a progressive manner. Each embodiment highlights the differences from other embodiments, and the same similar parts in the embodiments can be found in each other.

The above-mentioned embodiments only represent several embodiments of the present application, but should not be construed as limiting the scope of the patent application. It should be pointed out that for those skilled in the art, several modifications and improvements can be made without departing from the concept of the present application, which all belong to the protection scope of the present application. Therefore, the scope of protection of the patent of the present application shall be subject to the appended claims.

What is claimed is:

1. A conductive silver aluminum paste, comprising a silver powder, an aluminum powder, a silicon powder, a first-type glass powder, a second-type glass powder and an organic vehicle; the conductive silver aluminum paste having a total weight of 100% and comprising the following components by weight percentage:
    80.0%-90.0% of silver powder;
    0.3%-2.5% of aluminum powder;
    0.0%-1.5% of silicon powder;
    1.0%-6.0% of first-type glass powder;
    0.5%-4.0% of second-type glass powder; and
    7.0%-15.0% of organic vehicle;

wherein the first-type glass powder is Pb-Zn-B-O-M glass powder, and the second-type glass powders is Ba-B-O-M glass powder, M is at least one of alkali metal elements; the organic vehicle is a vehicle of organic resin and/or cellulose, and a content of the organic resin and/or the cellulose in the organic vehicle is not higher than 10.0% of a total mass of the organic vehicle.

2. The conductive silver aluminum paste according to claim 1, wherein the first-type glass powder has a total mole number of 100% for all components and comprises the following components by molar percentage:
    25.0%-60.0% of PbO;
    5.0%-20.0% of ZnO;
    10.0%-50.0% of $B_2O_3$;
    5.0%-20.0% of alkali metal element substance; and
    0.0%-20.0% of a first-type modified element additive.

3. The conductive silver aluminum paste according to claim 2, wherein the first-type modified element additive is an oxide containing one or more elements selected from the group consisting of Al, Tl, Ca, Mg, Si, Bi, Ge and Te, or a compound of element oxides decomposed from a preparation process of the first-type glass powder.

4. The conductive silver aluminum paste according to claim 1, wherein the second-type glass powder has a total mole number of 100% for all components and comprises the following components by molar percentage:
    25.0%-50.0% of BaO;
    10.0%-50.0% of $B_2O_3$;
    5.0%-25.0% of alkali metal element substance; and
    0.0%-35.0% of a second-type modified element additive.

5. The conductive silver aluminum paste according to claim 4, wherein the second-type modified element additive is an oxide containing one or more selected from the group consisting of Al, Tl, Ca, Mg, Si, Bi, Ge, Te, Pb and Zn, or a compound of element oxides decomposed from a preparation process of the second-type glass powder.

6. The conductive silver aluminum paste according to claim 1, wherein the alkali metal element substance is an oxide or halide containing one or more elements selected from the group consisting of Li, Na, K and Rb, or a compound of alkali metal oxides decomposed from a preparation process of glass powder.

7. The conductive silver aluminum paste according to claim 1, wherein the organic vehicle further comprises an organic solvent, a thickening agent and an antifoaming agent, and the organic vehicle has a total weight of 100% and comprises the following components by weight:

60.0%-80.0% of organic solvent;
0.0%-10.0% organic resin or cellulose;
5.0%-20.0% of thickening agent; and
0.1%-20.0% of antifoaming agent.

8. A method for preparing the conductive silver aluminum paste according to claim 1, comprising the following steps:

(1) preparation of first-type glass powder, second-type of glass powder and organic vehicle: weighing raw materials for the first-type glass powder according to a preset formula ratio, mixing, then heating, melting, cooling and drying, and then milling to yield the first-type glass powder; weighing raw materials for the second-type glass powder according to a preset formula ratio, mixing, then heating, melting, cooling and drying, and then milling to yield the second-type glass powder; and weighing raw materials for the organic vehicle according to a preset formula ratio, stirring and mixing, and dispersing evenly by high-speed centrifugation to yield the organic vehicle; and (2) preparation of conductive silver aluminum paste: adding the silver powder, the aluminum powder, the silicon powder, the prepared first-type glass powder and the prepared second-type glass powder in mass ratio to the prepared organic vehicle, stirring and mixing evenly, pulping, filtering and pulp conditioning to yield the conductive silver aluminum paste.

9. An electrode, comprising the conductive silver aluminum paste according to claim 1.

10. A cell containing conductive silver aluminum paste, comprising the electrode according to claim 9.

* * * * *